US009364925B2

(12) United States Patent
Barwicz et al.

(10) Patent No.: US 9,364,925 B2
(45) Date of Patent: Jun. 14, 2016

(54) ASSEMBLY OF ELECTRONIC AND OPTICAL DEVICES

(75) Inventors: Tymon Barwicz, Yorktown Heights, NY (US); Bing Dang, Chappaqua, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 873 days.

(21) Appl. No.: 13/459,460

(22) Filed: Apr. 30, 2012

(65) Prior Publication Data

US 2013/0283584 A1 Oct. 31, 2013

(51) Int. Cl.
*B25B 27/14* (2006.01)
*B23P 11/00* (2006.01)
*B25B 11/02* (2006.01)
*H05K 13/04* (2006.01)

(52) U.S. Cl.
CPC ............... *B23P 11/00* (2013.01); *B25B 11/02* (2013.01); *H05K 13/0404* (2013.01); *H05K 13/0408* (2013.01); *Y10T 29/49126* (2015.01); *Y10T 29/49133* (2015.01); *Y10T 29/49826* (2015.01); *Y10T 29/49895* (2015.01); *Y10T 29/49901* (2015.01); *Y10T 29/53174* (2015.01); *Y10T 29/53191* (2015.01); *Y10T 29/53974* (2015.01)

(58) Field of Classification Search
USPC ............................................ 29/281.4; 904/41
See application file for complete search history.

(56) References Cited

U.S. PATENT DOCUMENTS

| | | | |
|---|---|---|---|
| 2,289,524 A * | 7/1942 | Smith et al. ................... 425/400 |
| 3,165,232 A | 1/1965 | Stern | |
| 3,670,387 A | 6/1972 | Nagao | |
| 3,759,418 A | 9/1973 | Willson et al. | |
| 3,920,130 A | 11/1975 | Edgett | |
| 4,295,596 A | 10/1981 | Doten et al. | |
| 4,652,095 A * | 3/1987 | Mauro ............................ 359/393 |
| 4,979,949 A * | 12/1990 | Matsen, III .............. A61B 17/15 414/9 |
| 5,253,834 A * | 10/1993 | Sullivan et al. ............. 248/179.1 |
| 5,905,831 A * | 5/1999 | Boudreau et al. ................ 385/88 |
| 6,320,706 B1 * | 11/2001 | Richard et al. ................. 359/822 |
| 6,492,614 B2 | 12/2002 | Murdza et al. | |
| 6,512,642 B1 * | 1/2003 | Bourcier et al. ............... 359/813 |
| 6,575,444 B1 * | 6/2003 | Bidaud ............................ 269/91 |
| 6,594,418 B1 * | 7/2003 | Treptau et al. .................. 385/33 |
| 6,595,699 B1 | 7/2003 | Nguyen et al. | |
| 6,628,881 B2 | 9/2003 | Epitaux | |
| 6,710,944 B2 * | 3/2004 | Berto et al. .................... 359/813 |
| 6,774,651 B1 | 8/2004 | Hembree | |
| 6,909,827 B2 * | 6/2005 | Schmitt et al. .................. 385/52 |

(Continued)

OTHER PUBLICATIONS

B. E. Kratochvil, et al., "Design of a visually guided 6 DOF micromanipulator system for 3d assembly of hybrid MEMS," Int. Workshop on Microfactories, Shainghai, 2004, pp. 128-133.

(Continued)

*Primary Examiner* — Joseph J Hail
*Assistant Examiner* — Alvin Grant
(74) *Attorney, Agent, or Firm* — Michael LeStrange; Andrew M. Calderon; Roberts Mlotkowski Safran & Cole, P.C.

(57) ABSTRACT

An assembly tool apparatus includes a manipulator having a range of motion defined by a plane and an axis that is substantially normal to the plane, a jig having an assembly surface operative to move from a first orientation relative to the axis to a second orientation relative to the axis, a first tool tip operative to engage with and be positioned by the manipulator, and a second tool tip operative to engage with and be positioned by the manipulator.

8 Claims, 13 Drawing Sheets

(56) References Cited

U.S. PATENT DOCUMENTS

| | | | |
|---|---|---|---|
| 6,937,406 B2 * | 8/2005 | Matsushima et al. | 359/819 |
| 6,998,858 B2 * | 2/2006 | Sawada | G01R 31/2887 324/750.22 |
| 7,062,133 B2 * | 6/2006 | Azimi et al. | 385/52 |
| 7,105,376 B1 | 9/2006 | Brewer et al. | |
| 7,146,082 B2 * | 12/2006 | Zbinden | 385/50 |
| 7,187,188 B2 * | 3/2007 | Andrews | G01R 31/2887 324/750.03 |
| 7,246,780 B2 * | 7/2007 | Oddsen, Jr. | A47B 49/00 211/26 |
| 7,250,779 B2 * | 7/2007 | Dunklee | G01R 31/2851 324/754.03 |
| 7,306,509 B2 * | 12/2007 | Hoshino | 451/41 |
| 7,349,604 B2 * | 3/2008 | Clark | 385/52 |
| 7,368,930 B2 * | 5/2008 | Hobbs | G01R 31/2891 324/756.03 |
| 7,415,321 B2 * | 8/2008 | Okazaki | B25J 9/1697 318/568.1 |
| 7,548,673 B2 | 6/2009 | Azimi et al. | |
| 7,554,322 B2 * | 6/2009 | Nordgren | G01R 31/2886 324/750.25 |
| 7,644,898 B2 * | 1/2010 | White | A61B 19/0248 211/26 |
| 7,671,614 B2 * | 3/2010 | Eldridge | G01R 31/2891 324/750.19 |
| 8,120,373 B2 * | 2/2012 | Hobbs et al. | 324/754.07 |
| 8,720,873 B2 * | 5/2014 | Hayashi et al. | 269/21 |
| 2003/0026548 A1 * | 2/2003 | Bourcier | G02B 6/4226 385/52 |
| 2005/0166413 A1 * | 8/2005 | Crampton | B25J 13/088 33/503 |
| 2008/0159694 A1 * | 7/2008 | Payne | G06F 3/0421 385/33 |
| 2009/0000136 A1 * | 1/2009 | Crampton | B25J 13/088 33/503 |
| 2009/0056098 A1 | 3/2009 | Payne | |
| 2010/0074581 A1 * | 3/2010 | Tanobe et al. | 385/93 |
| 2011/0069929 A1 | 3/2011 | Bhagavatula et al. | |
| 2012/0263416 A1 * | 10/2012 | Morioka | 385/33 |
| 2013/0283584 A1 * | 10/2013 | Barwicz | H05K 13/0404 29/281.4 |

OTHER PUBLICATIONS

C. J. Morris, et al., "Self-assembly for microscale and nanoscale packaging: steps toward self-packaging," IEEE Transactions on Advanced Packaging, vol. 28, No. 4, Nov. 2005, pp. 600-611.

* cited by examiner

FIG. 15

ASSEMBLY OF ELECTRONIC AND OPTICAL DEVICES

FIELD OF INVENTION

The present invention relates generally to the assembly of electronic and optical devices, and more specifically, to the assembly of electronic and optical devices at oblique angles.

DESCRIPTION OF RELATED ART

Previous electronic assembly tools are designed to assemble components on horizontal surfaces. Such tools are often capable of aligning components in an x-y plane parallel to a planar working surface or jig. Such tools are capable of applying a precise force while assembling the components along a z-axis, normal to the x-y plane.

BRIEF SUMMARY

According to one embodiment of the present invention, an assembly tool apparatus includes a manipulator having a range of motion defined by a plane and an axis that is substantially normal to the plane, a jig having an assembly surface operative to move from a first orientation relative to the axis to a second orientation relative to the axis, a first tool tip operative to engage with and be positioned by the manipulator, and a second tool tip operative to engage with and be positioned by the manipulator.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 13-15 illustrate an alternate exemplary method for assembling components of an optical fiber array, in this regard:

DETAILED DESCRIPTION

Figure 1:
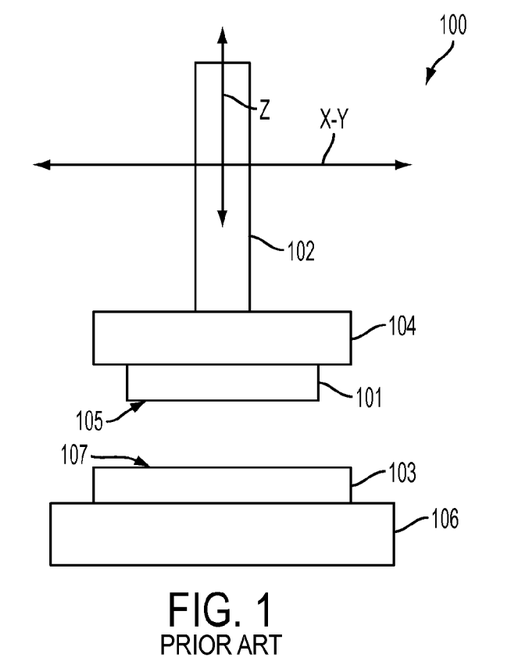
FIG. 1 illustrates a prior art arrangement of an assembly tool and a jig.

With reference now to FIG. 1, a prior art arrangement of an assembly tool 100 and a jig 106 is illustrated. The assembly tool 100 includes a manipulator 102 that is operable to move in the X-Y plane and along the Z-axis. The manipulator 102 is connected to a tool tip 104 that is removable, and may be exchanged with other tool tips. The tool tip 104 is operable to secure and manipulate a first component 101 having a mating surface 105 using any suitable securing methods such as, for example, pneumatic suction, or a mechanical securing fixture. A jig 106 is arranged in the assembly tool 100 and is operative to secure a second component 103 on a planar surface 108 of the jig 106. In operation, the jig 106 remains substantially stationary, while the manipulator 102 is used to pick up the first component 101 precisely position the first component 101 relative to the second component 103 in the X-Y plane. Once the first component is positioned in the X-Y plane, the manipulator 102 positions the first component 101 to engage with or contact a mating surface 107 of the second component 103 by moving the first component 101 relative to the second component 103 along the Z-axis. The assembly tool 100 is capable of precisely maintaining the position of the first component 101 relative to the second component 103 in the X-Y plane while applying a precise force to the first component 101 along the Z-axis. The precise force along the Z-axis is used to affect the assembly or joining of the first component 101 with the second component.

The use of the assembly tool 100 described above is effective when assembling components having substantially planar mating surfaces that may be assembled by applying a force substantially normal the planar surfaces. However, it is desirable to assemble some components by applying a force at an oblique angle to the mating surfaces. The assembly tool 100 is designed to apply a precise force along the Z-axis, as opposed to applying a precise force in the X-Y plane, and typically does not provide adequate control of a force applied in the X-Y plane. Thus, a method for assembling components by applying a force at an angle oblique to the substantially planar mating surfaces is desired.

Figure 2:
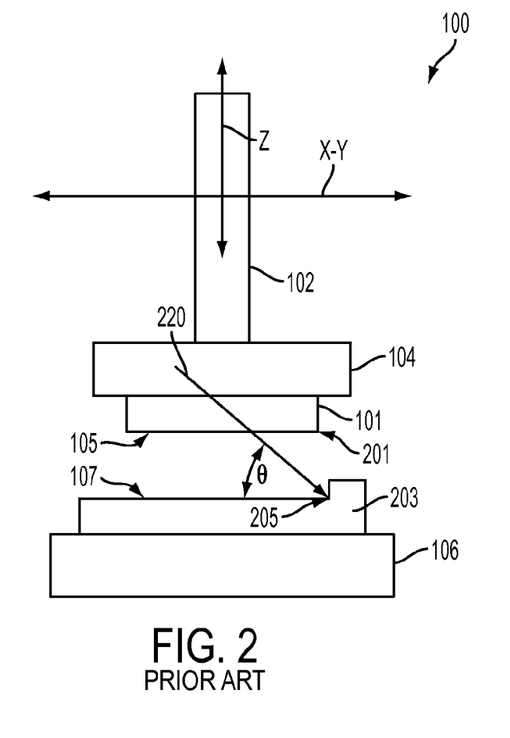
FIG. 2 illustrates another prior art arrangement of an assembly tool and a jig.

FIG. 2 illustrates the assembly tool 100 in an arrangement similar to the arrangement described above in FIG. 1. However, a second component 203 includes a feature that defines a corner 205 that is operative to engage a corner 201 of the first component 101. It is desirable to apply a force during assembly along the line 220 that defines an oblique angle ($\theta$) relative to the planar mating surface 107 of the second component 203. Though the illustrated embodiment shows the corners 201 and 205, the embodiments described herein are not limited to assembling components having corners of any shape. For example, any type of components having any shape may be assembled using the embodiments and methods below to provide a precise force at an oblique angle relative to one of the mating surfaces.

Figure 3:
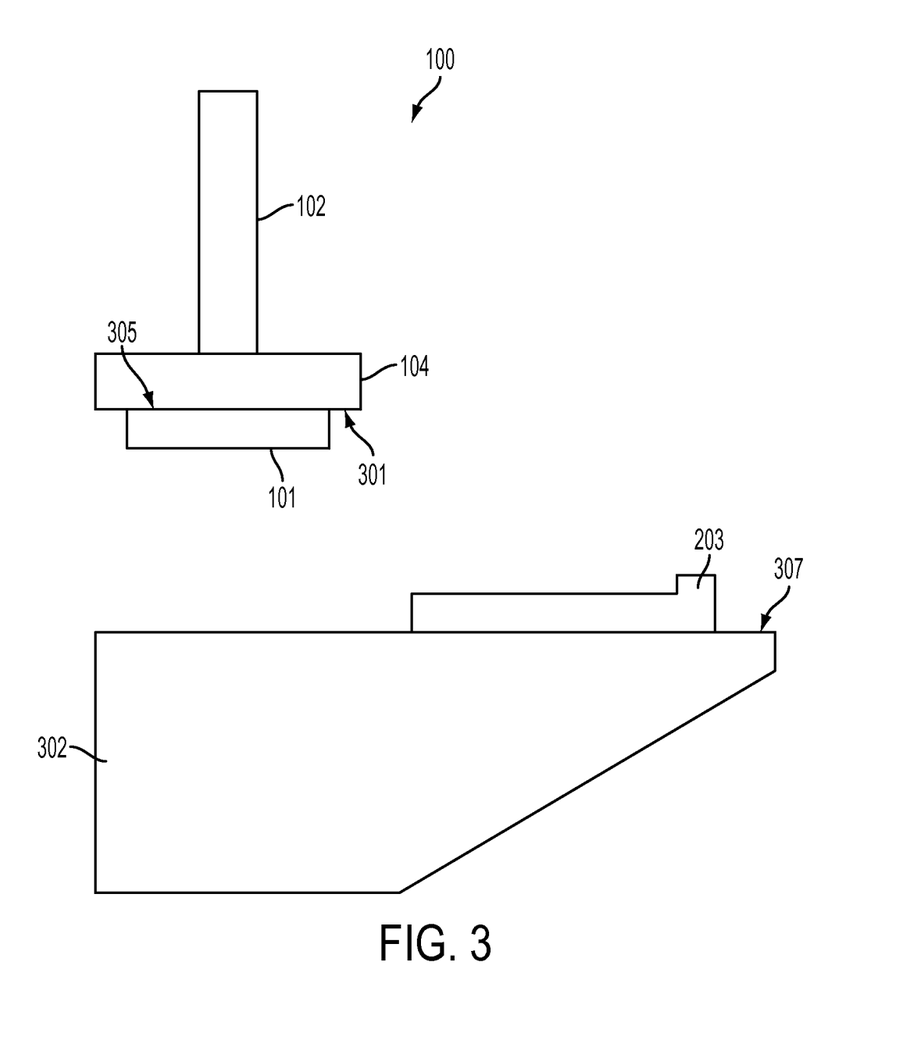
FIG. 3 illustrates an exemplary embodiment of a jig that is arranged in an assembly tool.

Methods and apparatuses operative to apply a precise force at an oblique angle relative to one of the mating surfaces of components are described in FIGS. 3-8 below. In this regard, FIG. 3 illustrates an exemplary embodiment of a jig 302 that is arranged in an assembly tool 100. The second component 203 is shown disposed on a substantially planar assembly surface 307 of the jig 302. The component 203 may be held in place on surface 307 using any suitable securing methods such as, for example, pneumatic suction, or a mechanical securing fixture. The manipulator 102 is connected to the tool tip 104 having an engagement surface 301 that defines a plane relatively parallel to a planar surface 305 of the first component 101. The tool tip 104 has secured the first component 101 to the engagement surface 301.

Figure 4:
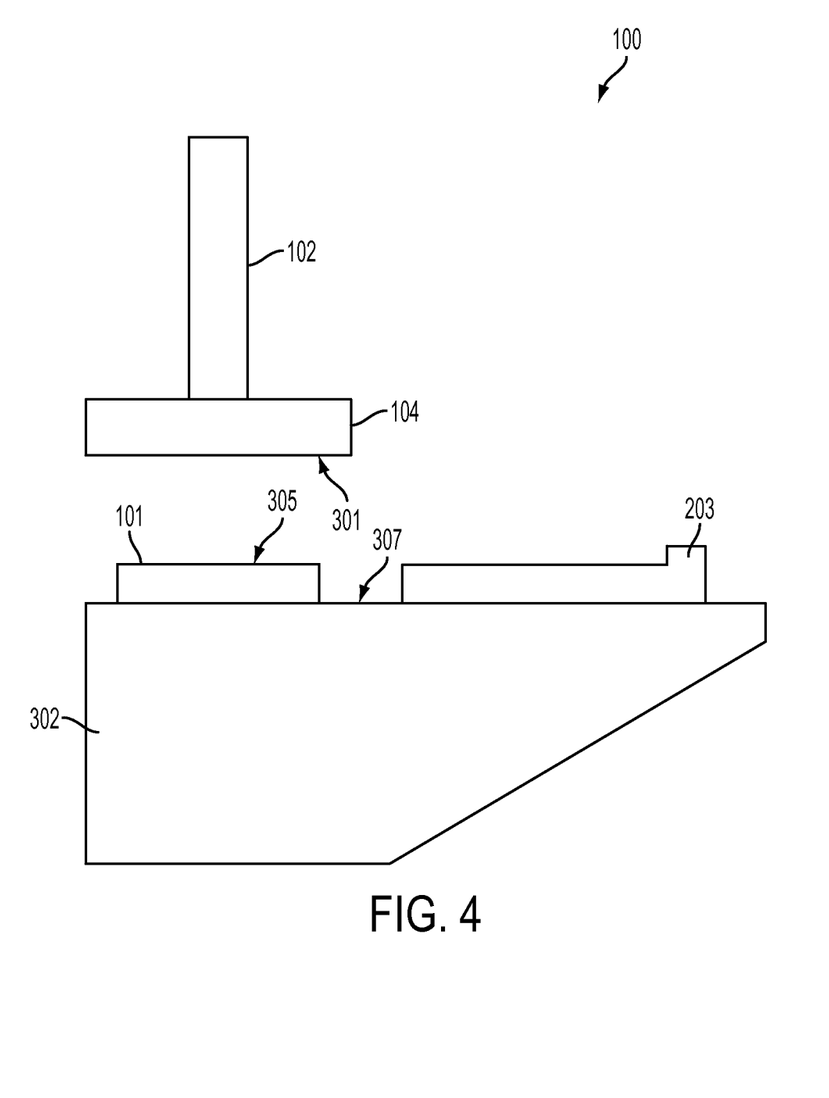
FIG. 4 illustrates the deposition of a first component on the assembly surface of the jig.

FIG. 4 illustrates the deposition of the first component 101 on the assembly surface 307 of the jig 302. In this regard, the manipulator 102 positions the first component on a portion of the assembly surface 307, and the securing means of the tool tip 104 releases the first component 101. The component 101 may be secured on surface 307 using any suitable securing methods such as, for example, pneumatic suction, or a mechanical securing fixture.

Figure 5:
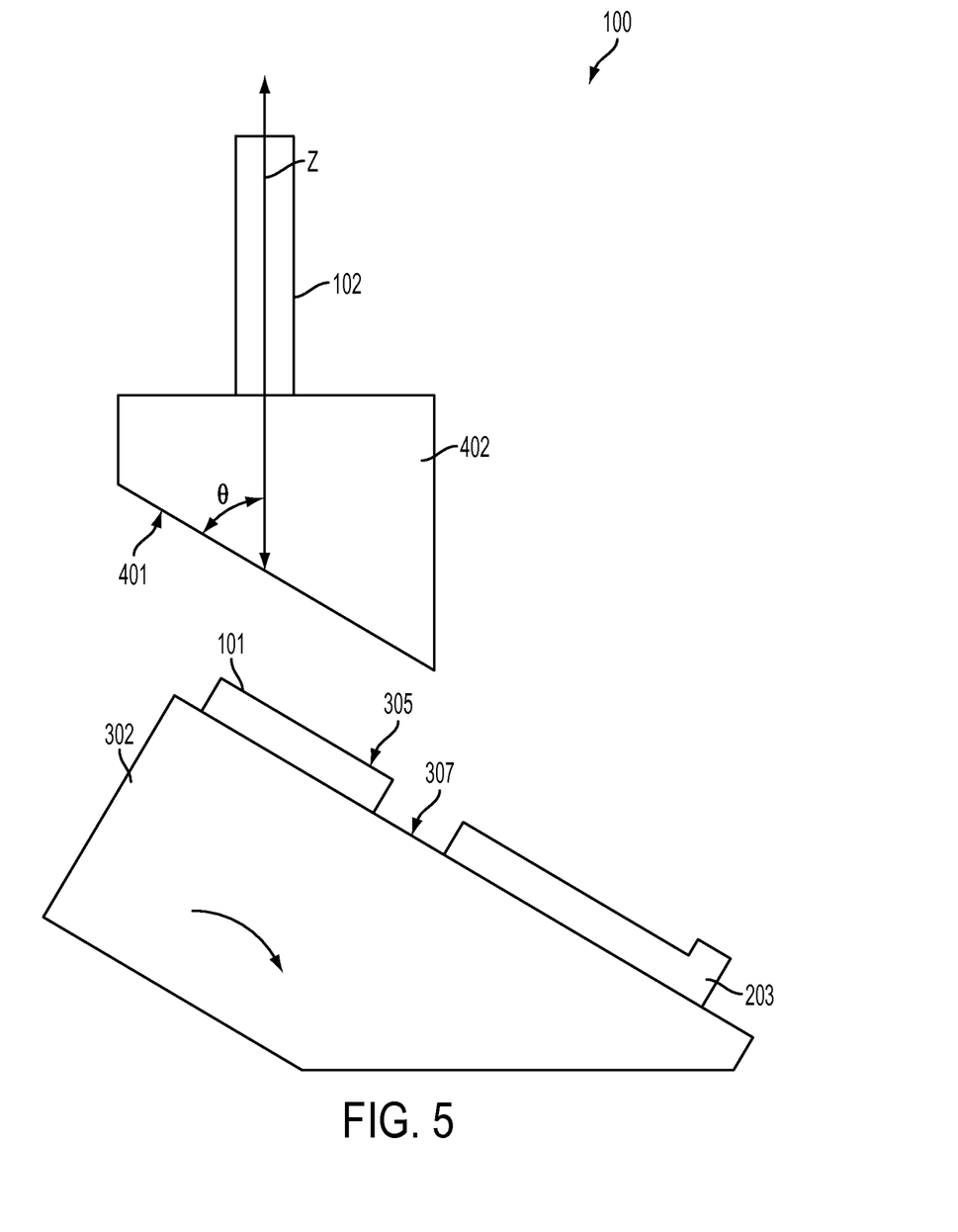
FIG. 5 illustrates the repositioning of the jig.

FIG. 5 illustrates the repositioning of the jig 302 such that the jig 302 is arranged at a desired angle for assembly. The manipulator 102 replaces the tool tip 104 with a tool tip 402 that has an engagement surface 401 that defines a plane that is at an oblique angle (A) relative to the Z-axis of movement of the manipulator 102. The jig 302 is repositioned such that the assembly surface 307 is arranged at the oblique angle θ relative to the Z-axis of movement of the manipulator 102 and is parallel to the engagement surface 401 of the tool tip 402. The repositioning of the jig 302 changes the alignment of the first component 101 and the second component 203 such that the planar surface 305 of the first component 101 is substantially parallel to the engagement surface 401 of the tool tip 402.

Figure 6:
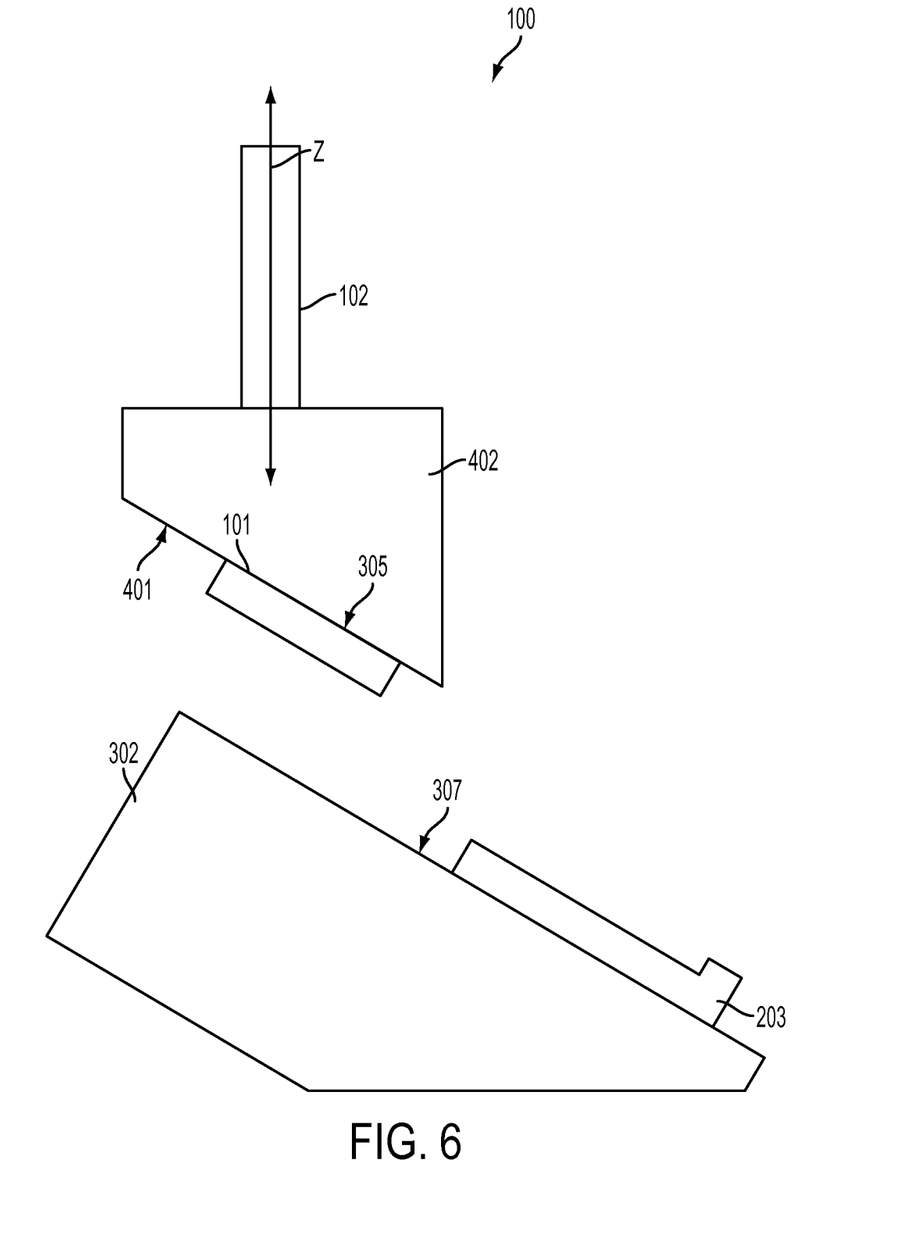
FIG. 6 illustrates the arrangement of the assembly tool following lifting the first component from the assembly surface.

FIG. 6 illustrates the arrangement of the assembly tool 100 following lifting the first component 101 from the assembly surface 307 by the tool tip 402.

Figure 7:
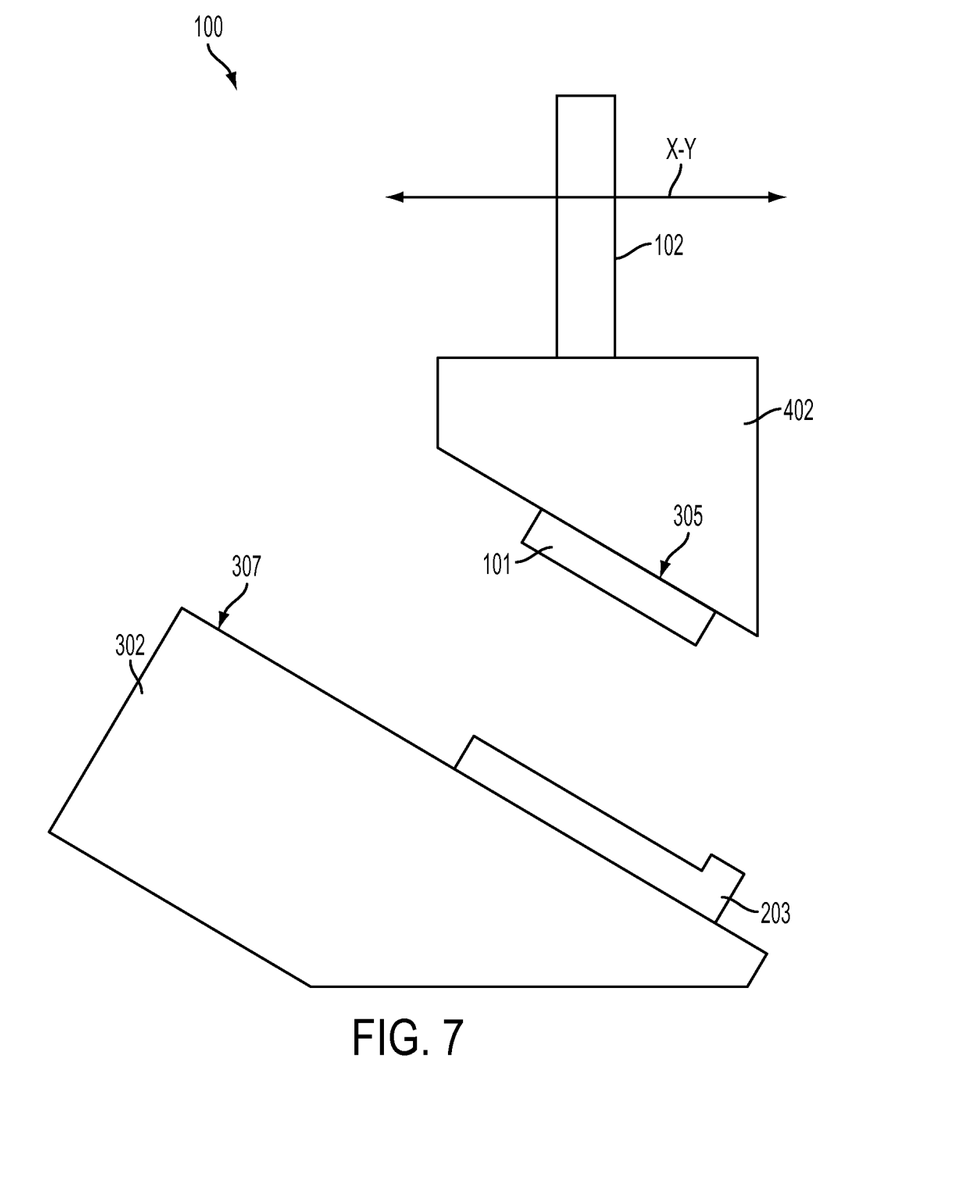
FIG. 7 illustrates the arrangement of the assembly tool following the alignment of the first component with a second component.

FIG. 7 illustrates the arrangement of the assembly tool 100 following the alignment of the first component 101 with the second component 203 in the X-Y plane.

Figure 8:
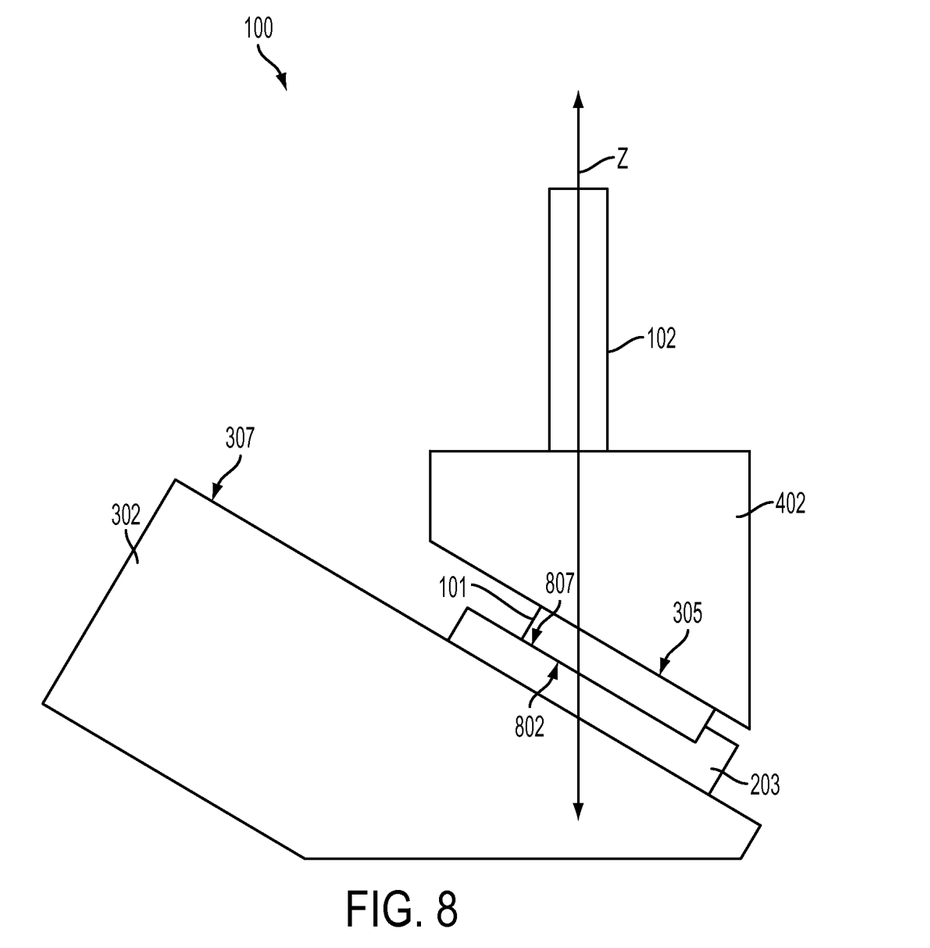
FIG. 8 illustrates the deposition of the mating surface of the first component with the mating surface of the second component.

FIG. 8 illustrates the deposition or joining of the mating surface 802 of the first component 101 on or with the mating surface 807 of the second component 203 by positioning the first component 101 relative to the second component 203 along the Z-axis of motion of the manipulator 102, and applying a desired precise force along the Z-axis. The positions of the assembly surface 307, the mating surface 802 of the first component 101, and the mating surface 807 of the second component 203 relative to the Z-axis of motion of the manipulator 102 provide for the application of force by the manipulator 102 along the Z-axis at the oblique angle θ relative to the assembly surface 307, the mating surface 802 of the first component 101, and the mating surface 807 of the second component 203. Following the deposition of the first component 101 on the second component 203, the first component 101 may be released from the tool tip 402. The jig 302 may be repositioned such that the assembly surface 307 is substantially orthogonal to the Z-axis of motion of the manipulator 102 as shown in FIG. 4, and the tool tip 402 may be replaced by the tool tip 104 (of FIG. 2). The assembled first component 101 and second component 203 may be lifted by the tool tip 104 and placed in a desired location. A second set of components may be placed on the jig 302 in the arrangement shown in FIG. 4, and the process described above may be repeated.

Figure 9:
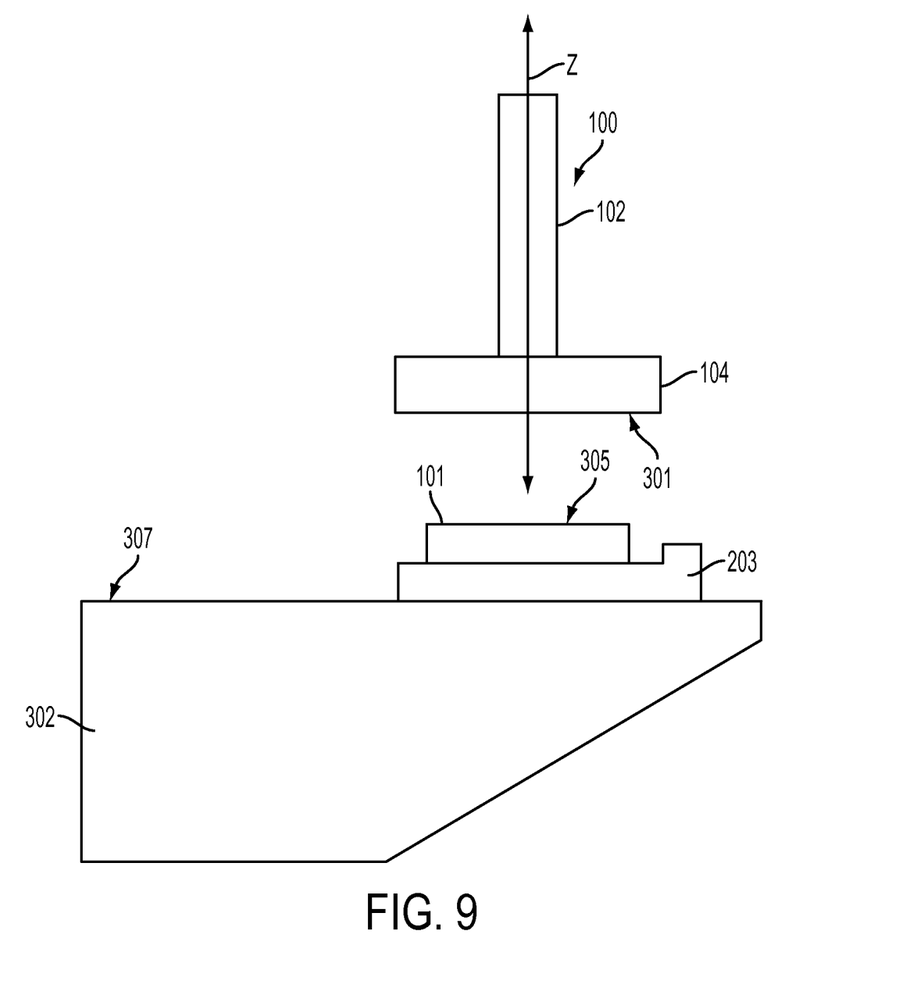
FIG. 9 illustrates an alternate exemplary method for assembling the first component and the second component.

FIG. 9 illustrates an alternate exemplary method for assembling the first component 101 and the second component 203. In this regard, the first component 101 is placed in a desired position on the second component 203 using the tool tip 104 while the jig 302 is arranged such that the assembly surface 307 is substantially orthogonal to the Z-axis of motion of the manipulator 102.

Figure 10:
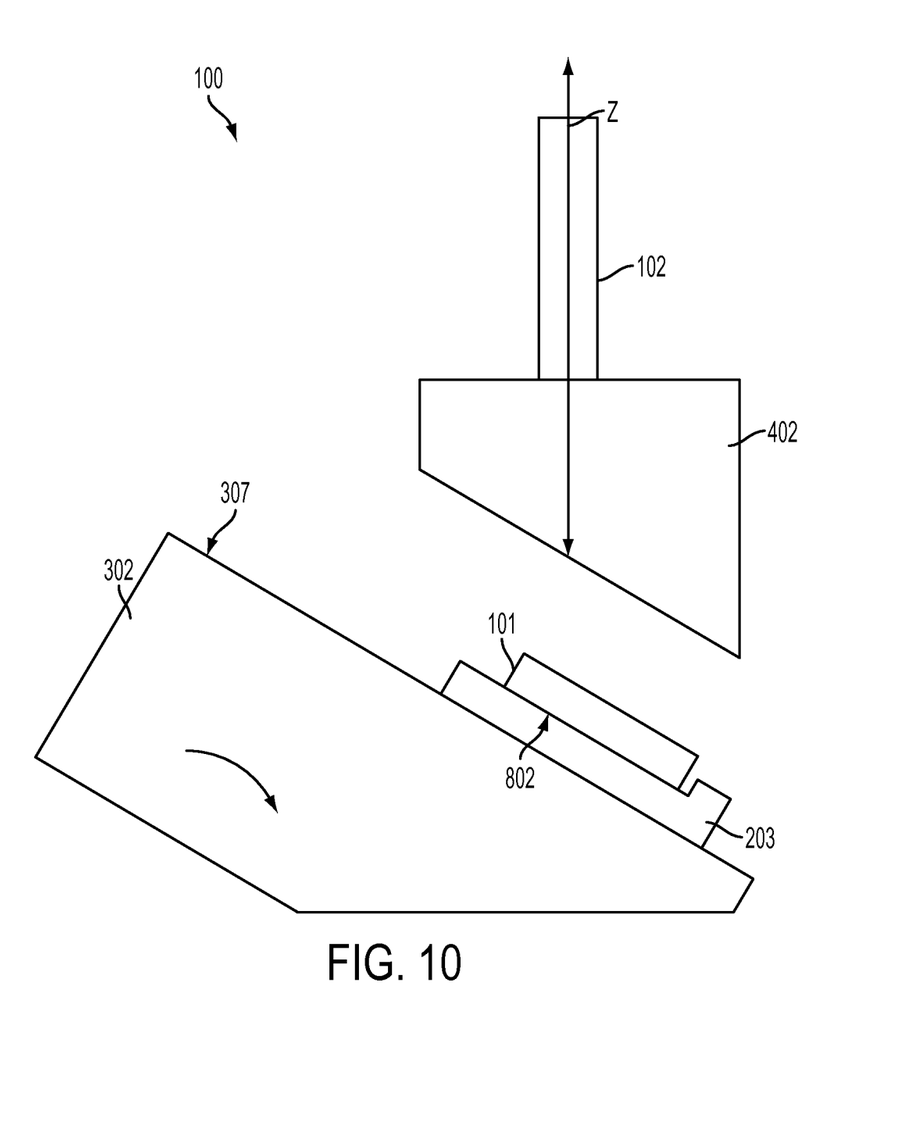
FIG. 10 illustrates the replacement of the tool tip and the repositioning of the jig.

FIG. 10 illustrates the replacement of the tool tip 104 with the tool tip 402, and the repositioning of the jig 302 such that the assembly surface 307 is arranged at an oblique angle relative to the Z-axis of motion of the manipulator 102.

Figure 11:
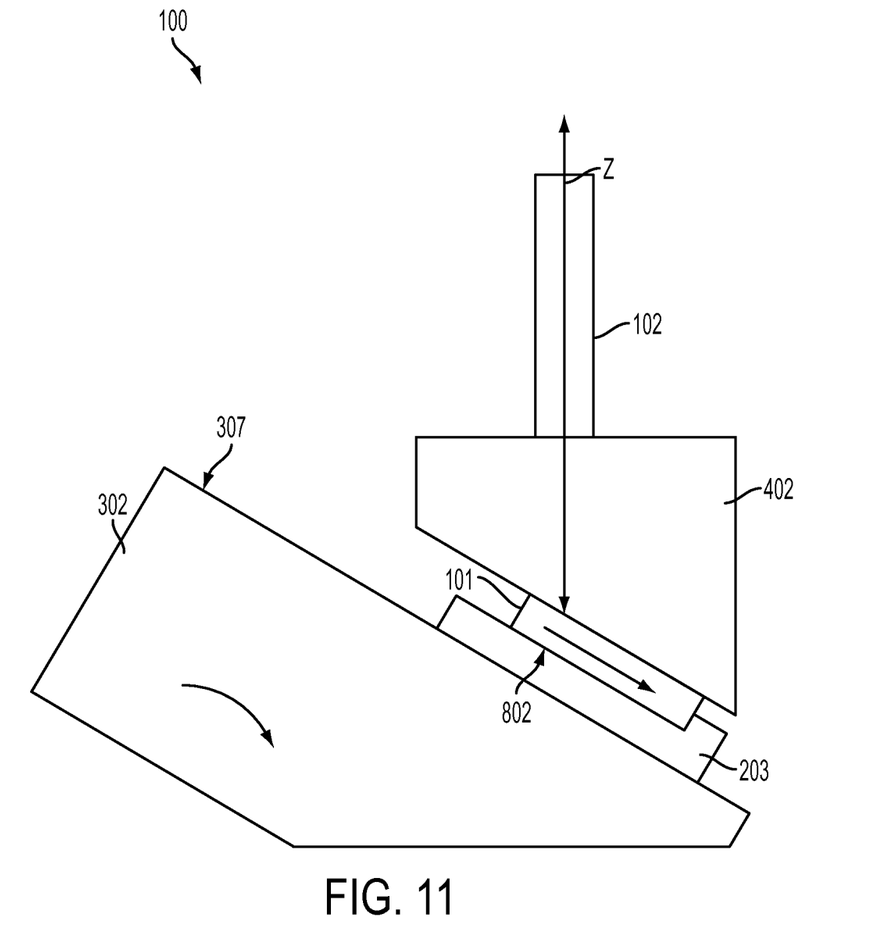
FIG. 11 illustrates the application of a force along the Z-axis of motion of the manipulator.

FIG. 11 illustrates the application of a force along the Z-axis of motion of the manipulator 102 that is operative to slide or push the first component at an oblique angle relative to the Z-axis of motion of the manipulator 102 into a desired position on the second component 203 and, if desired affect the joining of the first component 101 with the second component 203.

The jig 302 of the illustrated embodiments may include any suitable assembly having an assembly surface 307. The jig 302 may include, for example a planar assembly surface 307 arranged on an actuator that is operative to change the orientation of the assembly surface 307 relative to the Z-axis of motion of the manipulator 102 from an orthogonal orientation to an oblique angle that is parallel to the engagement surface 401 of the tool tip 402.

The components 101 and 203 may include any type of components including, for example, electronic, or electrical components, or optical components such as optical fiber array packaging components.

Figure 12:
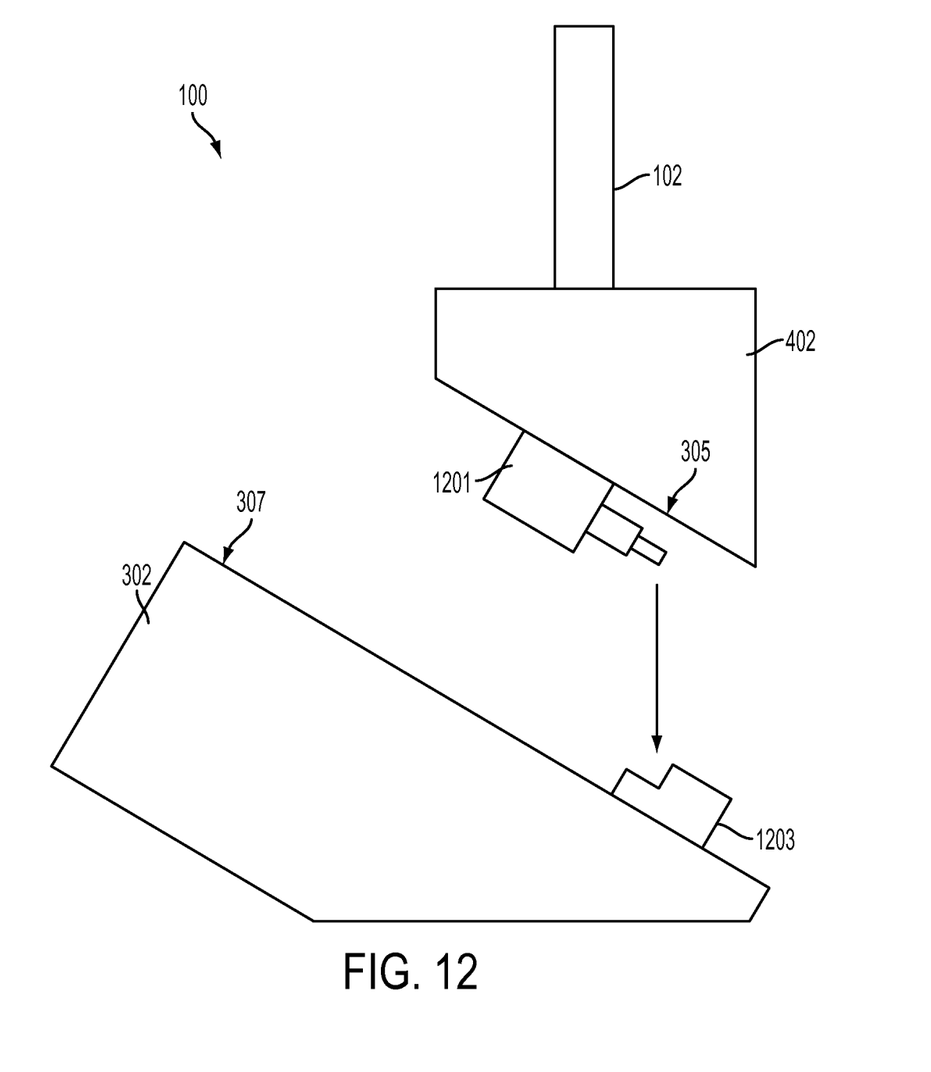
FIG. 12 illustrates an arrangement of the assembly tool that includes components of an optical fiber array assembly.

In this regard, FIG. 12 illustrates an arrangement of the assembly tool 100 that includes components of an optical fiber array assembly that have been manipulated in a similar manner as described above in FIGS. 3-7. The optical fiber array assembly includes a first component 1201 that is secured by the tool tip 402 and a second component 1203 that is arranged on the assembly surface 307 of the jig 302. The first component 1201 of the illustrated embodiment includes at least one optical fiber and may include an optical fiber ferrule. The optical fiber may include a glass ($SiO_2$ with core region doped with various elements such as Ge) and polymers. The second component 1203 may include at least one groove to secure an optical fiber. The second component 1203 may include a polymer, a dielectric ($SiO_2$, $Al_2O_3$, AlN), or a semiconductor material (Si, Ge, GaAs, InP, GaInAsP). The groove include, for example, a U-shaped groove or V-shaped groove. Once the first component has been lifted by the tool tip 402, the assembly tool 100 is operative to assemble the first component 1201 and the second component 1203 of the optical fiber assembly in a similar manner as described in FIG. 8 above.

Figure 13:
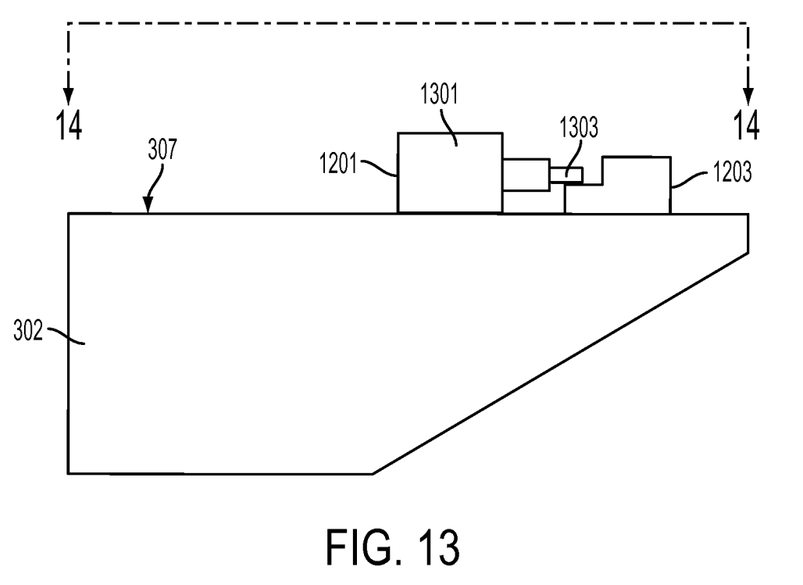
FIG. 13 illustrates a side view of the first component and the second component.
Figure 14:
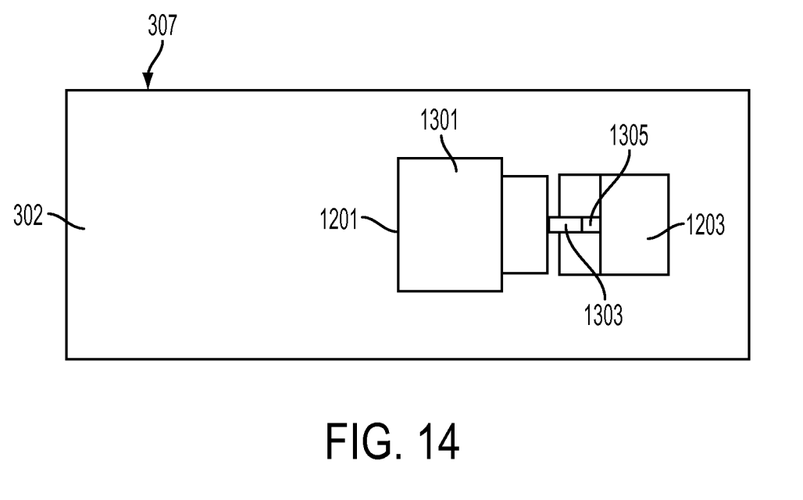
FIG. 14 illustrates a top view of the first component and the second component along the line 14 of FIG. 13.
Figure 15:
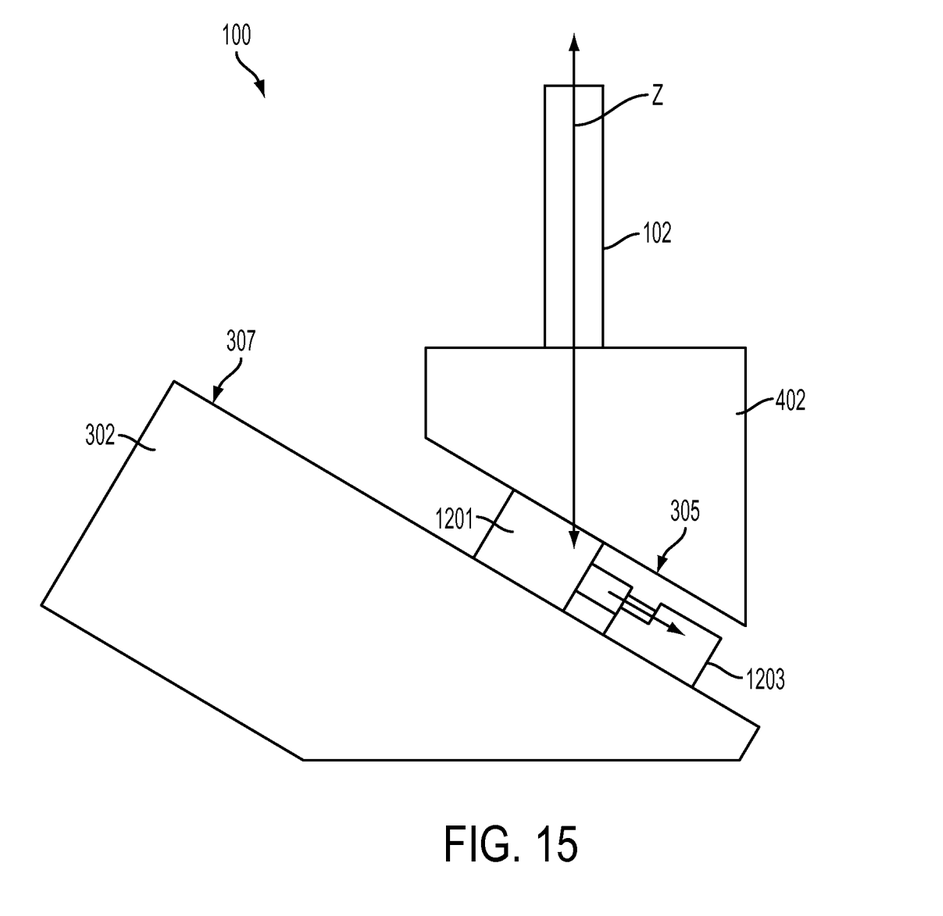
FIG. 15 illustrates the application of a force along the Z-axis of motion of the manipulator.

FIGS. 13-15 illustrate an alternate exemplary method for assembling components of an optical fiber array. The optical fiber array assembly includes a first component 1201 and a second component 1203 that are arranged on the assembly surface 307 of the jig 302 while the assembly surface is arranged in a substantially horizontal position. The first component includes a ferrule portion 1301 and a fiber portion 1303. A single fiber portion is shown in FIGS. 13-15 for simplicity while an optical fiber array may include a plurality of fiber portions disposed at a uniform pitch between 150 and 500 um and preferably 250 um. In operation, once the second component is arranged on the assembly surface 307 using similar methods as described above, the first component is placed on the assembly surface such that each fiber portion 1303 engages a groove 1305 (e.g., a U-shaped groove or a V-shaped groove) (of FIG. 14) using the manipulator 102 (of FIG. 1). FIG. 14 illustrates a top view of the first component 1201 and the second component 1203 along the line 14 (of FIG. 13).

FIG. 15 illustrates the application of a force along the Z-axis of motion of the manipulator 102 that is operative to slide or push the first component 1201 at an oblique angle relative to the Z-axis of motion of the manipulator 102 into a desired position on the second component 1203 and, if desired affect the joining of the first component 1201 with the second component 1203. The relative motion of the first component 1201 to the second component 1203 moves the fiber portion 1303 into a desired position in the grove 1305.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An assembly tool apparatus comprising:
    a manipulator having a range of motion defined by a plane and an axis that is substantially normal to the plane;
    a jig having a substantially planar assembly surface having a range of motion from a first orientation that arranges the substantially planar assembly surface to be substantially orthogonal to the axis to a second orientation that arranges the substantially planar assembly surface to be at an oblique angle relative to the axis, wherein the jig includes a securing portion operative to secure at least one of a first component and a second component to the assembly surface;
    a first tool tip operative to engage with and be positioned by the manipulator, the first tool tip having a substantially planar engagement surface that is arranged substantially parallel to the planar assembly surface when the planar assembly surface is arranged in the first orientation; and
    a second tool tip operative to engage with and be positioned by the manipulator, the second tool tip having a substantially planar engagement surface that is arranged at the oblique angle relative to the axis such that the engagement surface of the second tool tip is substantially parallel to the planar assembly surface when the planar assembly surface is arranged in the second orientation.

2. The apparatus of claim 1, wherein the apparatus is operative to apply a controlled force along the axis with the first tool tip and the second tool tip.

3. The apparatus of claim 1, wherein the assembly surface defines an assembly surface plane.

4. The apparatus of claim 3, wherein in the first orientation, the assembly surface plane is substantially orthogonal to the axis.

5. The apparatus of claim 3, wherein in the second orientation, the assembly surface plane is oblique relative to the axis.

6. The apparatus of claim 1, wherein the first tool tip includes an engagement surface defining a plane substantially parallel to an engagement surface of the first component disposed on the assembly surface while the assembly surface is arranged in the first orientation.

7. The apparatus of claim 1, wherein the second tool tip includes an engagement surface defining a plane substantially parallel to an engagement surface of the first component disposed on the assembly surface while the assembly surface is arranged in the second orientation.

8. The apparatus of claim 6, wherein the first component includes a component of an optical fiber array.

* * * * *